(12) United States Patent
Yoshikawa

(10) Patent No.: US 11,456,157 B2
(45) Date of Patent: *Sep. 27, 2022

(54) PLASMA PROCESSING APPARATUS

(71) Applicant: TOKYO ELECTRON LIMITED, Tokyo (JP)

(72) Inventor: Jun Yoshikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 10 days.

This patent is subject to a terminal disclaimer.

(21) Appl. No.: 16/752,153

(22) Filed: Jan. 24, 2020

(65) Prior Publication Data

US 2020/0161090 A1    May 21, 2020

Related U.S. Application Data

(63) Continuation of application No. 14/931,919, filed on Nov. 4, 2015, now Pat. No. 10,566,174.

(30) Foreign Application Priority Data

Nov. 5, 2014   (JP) ................................ 2014-225390

(51) Int. Cl.
*H01J 37/32*        (2006.01)
(52) U.S. Cl.
CPC .... *H01J 37/3244* (2013.01); *H01J 37/32192* (2013.01); *H01J 37/32816* (2013.01)
(58) Field of Classification Search
None
See application file for complete search history.

(56) References Cited

U.S. PATENT DOCUMENTS

| 4,854,263 A | 8/1989 | Chang et al. |
| 5,134,965 A | 8/1992 | Tokuda et al. |
| 5,824,605 A | 10/1998 | Chen et al. |
| 2005/0178748 A1 | 8/2005 | Buchberger, Jr. et al. |
| 2006/0219362 A1* | 10/2006 | Han ................. C23C 16/45565 156/345.33 |

(Continued)

FOREIGN PATENT DOCUMENTS

| JP | 9-283499 A | 10/1997 |
| JP | 2012-84848 A | 4/2012 |

(Continued)

*Primary Examiner* — Ram N Kackar
(74) *Attorney, Agent, or Firm* — Weihrouch IP

(57) ABSTRACT

A plasma processing apparatus includes a processing container that defines a processing space, a gas supply unit provided on a sidewall of the processing container and configured to supply gas to the processing space, a dielectric member having a facing surface that faces the processing space, and an antenna provided on a surface opposite to the facing surface of the dielectric member and configured to radiate microwaves that turn the gas into plasma to the processing space through the dielectric member. The gas supply unit includes a transport hole transporting the gas to a position where the gas does not reach the processing space in the inside of the sidewall of the processing container and an injection hole communicated to the transport hole and configured to inject the gas transported to the position into the processing space. The injection hole has a diameter larger than that of the transport hole.

9 Claims, 10 Drawing Sheets

(56) References Cited

U.S. PATENT DOCUMENTS

| | | | |
|---|---|---|---|
| 2008/0254220 A1* | 10/2008 | Tian | B32B 37/12 |
| | | | 427/271 |
| 2009/0065146 A1 | 3/2009 | Yamashita | |
| 2009/0229753 A1* | 9/2009 | Ohmi | H01L 21/67069 |
| | | | 156/345.34 |
| 2010/0037821 A1 | 2/2010 | Nogami | |
| 2010/0288439 A1* | 11/2010 | Ishibashi | H01J 37/3244 |
| | | | 156/345.33 |
| 2011/0214812 A1* | 9/2011 | Song | C23F 1/08 |
| | | | 118/728 |
| 2012/0160809 A1 | 6/2012 | Ishibashi et al. | |
| 2012/0180954 A1* | 7/2012 | Yang | H01J 37/32357 |
| | | | 156/345.34 |
| 2015/0380216 A1 | 12/2015 | Jang et al. | |

FOREIGN PATENT DOCUMENTS

| | | |
|---|---|---|
| JP | 5440604 B2 | 3/2014 |
| KR | 10-2012-0029350 A | 3/2012 |

* cited by examiner

| MW leak rate[%] | | cutoff freq [Hz] | Hole depth | | | | |
|---|---|---|---|---|---|---|---|
| | | | 0mm | 5mm | 10mm | 20mm | 30mm |
| Hole radius | 1mm | 8.78E+10 | 4.26E-04 | 3.22E-12 | 1.24E-19 | 3.97E-34 | 5.34E-47 |
| | 3mm | 2.93E+10 | 6.85E-02 | 4.07E-05 | 7.29E-08 | 2.62E-13 | 8.81E-19 |
| | 5mm | 1.76E+10 | 6.14E-01 | 5.15E-03 | 1.21E-04 | 7.33E-08 | 4.63E-11 |
| | 10mm | 8.78E+09 | 9.97E+00 | 7.47E-01 | 1.10E-01 | 2.99E-03 | 8.46E-05 |
| | 15mm | 5.86E+09 | 2.65E+01 | 8.85E+00 | 2.43E+00 | 2.34E-01 | 2.45E-02 |
| | 20mm | 4.39E+09 | 3.99E+01 | 3.09E+01 | 1.73E+01 | 3.80E+00 | 8.07E-01 |
| | 30mm | 2.93E+09 | 6.11E+01 | 4.31E+01 | 2.82E+01 | 2.00E+01 | 1.31E+01 |
| | 40mm | 2.20E+09 | 7.53E+01 | 5.69E+01 | 4.43E+01 | 2.37E+01 | 9.23E+00 |

PLASMA PROCESSING APPARATUS

CROSS-REFERENCE TO RELATED APPLICATIONS

This application is a Continuation of U.S. patent application Ser. No. 14/931,919, filed on Nov. 4, 2015, which claims priority from Japanese Patent Application No. 2014-225390, filed on Nov. 5, 2014 the disclosures of which are incorporated herein in their entirety by reference, and priority is claimed to each of the foregoing.

TECHNICAL FIELD

Various aspects and exemplary embodiments of the present disclosure are related to a plasma processing apparatus.

BACKGROUND

There is a plasma processing apparatus that uses excitation of a process gas by microwaves. The plasma processing apparatus radiates the microwaves for plasma excitation using an antenna to dissociate gas introduced into a processing space inside of a processing container, thereby generating plasma. Further, the plasma processing apparatus introduces the gas into the processing space from an injection hole formed on a sidewall of the processing container. See, for example, Japanese Patent No. 5440604.

SUMMARY

A plasma processing apparatus according to one aspect of the present disclosure includes a processing container that defines a processing space; a gas supply unit provided on a sidewall of the processing container, the gas supply unit being configured to supply a gas to the processing space; a dielectric member having a facing surface that faces the processing space, and an antenna provided on a surface opposite to the facing surface of the dielectric member, the antenna being configured to radiate microwaves that turn the gas into plasma to the processing space through the dielectric member. The gas supply unit includes: a transport hole configured to transport the gas to a position where the gas does not reach the processing space in the inside of the sidewall of the processing container, and an injection hole communicated to the transport hole and configured to inject the gas transported to the position into the processing space, the injection hole having a diameter larger than that of the transport hole.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
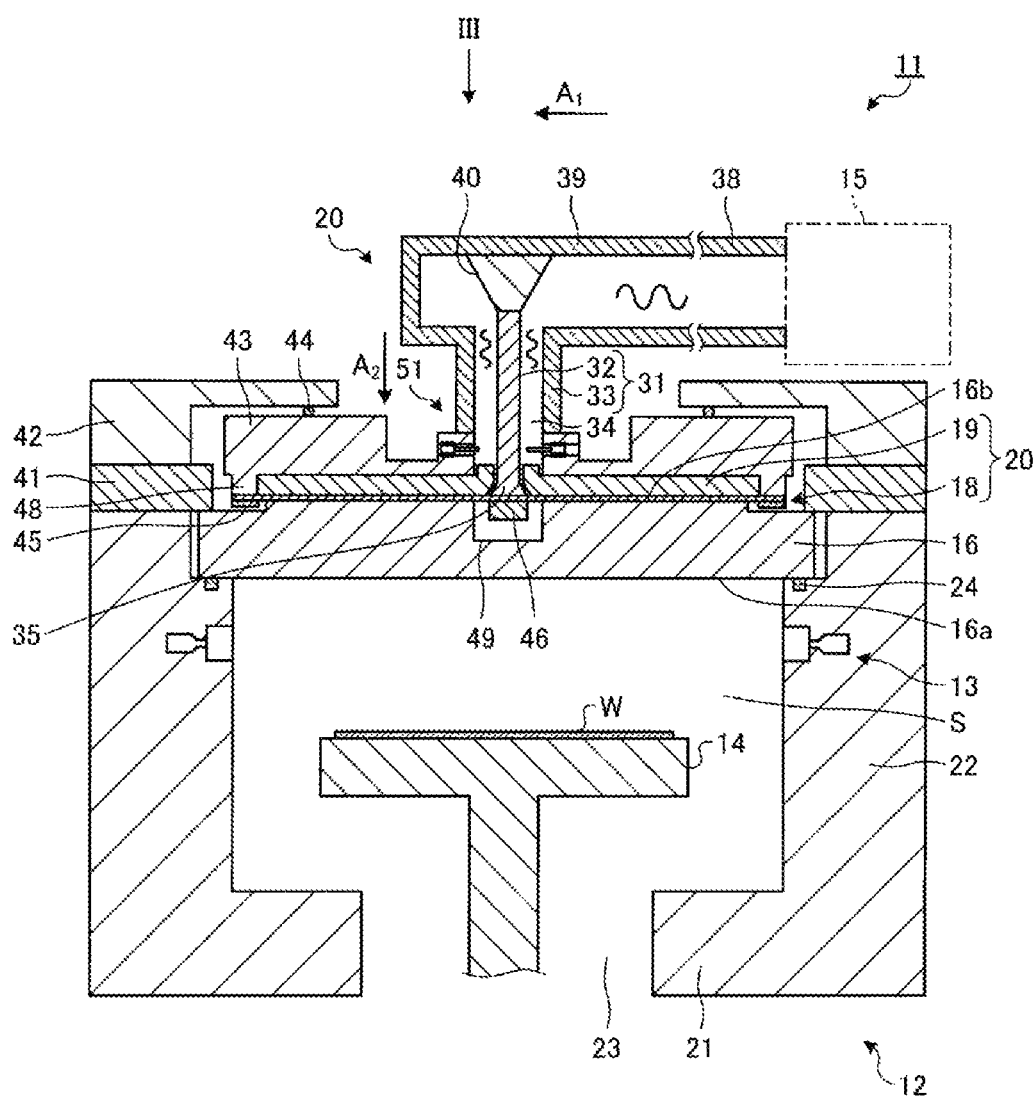
FIG. 1 is a schematic cross-sectional view illustrating a main part of a plasma processing apparatus according to a first exemplary embodiment.

In the following detailed description, reference is made to the accompanying drawings, which form a part hereof. The illustrative embodiments described in the detailed description, drawing, and claims are not meant to be limiting. Other exemplary embodiments may be utilized, and other changes may be made without departing from the spirit or scope of the subject matter presented here.

In the related art described above, there is a problem in that in a case where a pressure increases in the injection hole, electric discharge may be generated in the injection hole or in the vicinity of the hole due to the pressure increase.

A plasma processing apparatus according to one aspect of the present disclosure includes a processing container that defines a processing space; a gas supply unit provided on a sidewall of the processing container, the gas supply unit being configured to supply a gas to the processing space; a dielectric member having a facing surface that faces the processing space, and an antenna provided on a surface opposite to the facing surface of the dielectric member, the antenna being configured to radiate microwaves that turn the gas into plasma to the processing space through the dielectric member. The gas supply unit includes: a transport hole configured to transport the gas to a position where the gas does not reach the processing space in the inside of the sidewall of the processing container, and an injection hole communicated to the transport hole and configured to inject the gas transported to the position into the processing space, the injection hole having a diameter larger than that of the transport hole.

In the plasma processing apparatus, the diameter of the injection hole is smaller than a predetermined upper limit value, and the predetermined upper limit value is determined using the following Equation (1):

$$a < Pnm/(2\pi f(\mu\varepsilon)^{1/2}) \quad (1)$$

in which "a" is a radius of the injection hole (the predetermined upper limit value/2), "Pnm" is a Bessel function, "f" is a frequency of microwaves, "$\mu$" is a permeability, and "$\varepsilon$" is a dielectric constant.

In the plasma processing apparatus, the diameter of the injection hole is increased as going away from the transport hole.

The plasma processing apparatus further includes a cylindrical dielectric embedded in the sidewall of the processing container to surround a periphery of the injection hole in a state where one end thereof is exposed to the processing space. The cylindrical dielectric is configured to guide the microwaves radiated into the processing space by the antenna from one end to the other end.

The plasma processing apparatus further includes a plate-shaped dielectric embedded in an area interposed between the injection hole and the dielectric member of the sidewall of the processing container in a state where one end thereof is exposed to the processing space. The plate-shaped dielectric being configured to guide the microwaves radiated into the processing space by the antenna from one end to the other end.

In the plasma processing apparatus, assuming that a wavelength of the microwaves propagated in the inside of the cylindrical dielectric or the plate-shaped dielectric is $\lambda$, a length from one end to the other end in the cylindrical dielectric or the plate-shaped dielectric is $\lambda/5$ or more and $3\lambda/5$ or less.

The plasma processing apparatus further includes a plate-shaped conductor provided to protrude from the area interposed between the injection hole and the dielectric member of the sidewall of the processing container toward the processing space, the plate-shaped conductor being configured to shield the microwaves radiated into the processing space by the antenna.

According to various aspects and exemplary embodiments of the present disclosure, a plasma processing apparatus capable of introducing gas without generating electric discharge is realized.

Hereinafter, various exemplary embodiments will be described with reference to the accompanying drawings in detail. In the meantime, the same or corresponding portions in the respective drawings will be assigned the same reference numerals.

First Exemplary Embodiment

Figure 2:
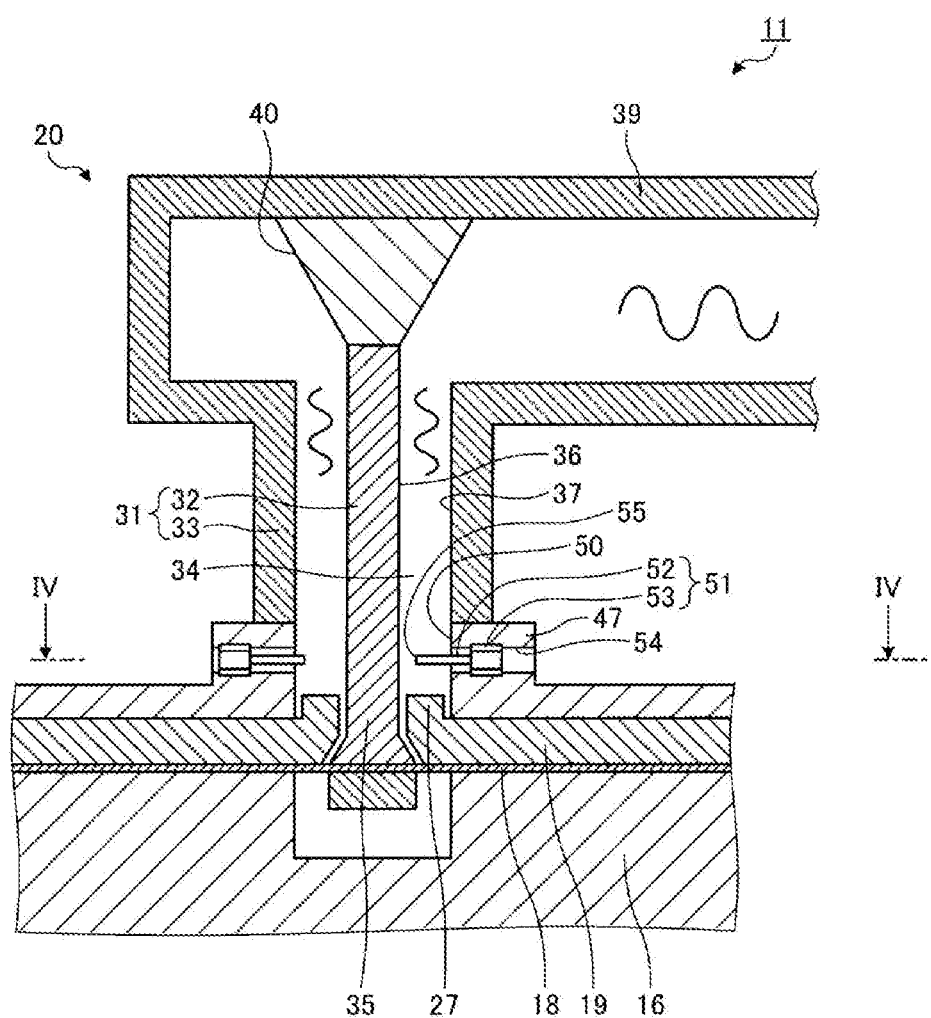
FIG. 2 is a schematic cross-sectional view illustrating the vicinity of a coaxial waveguide provided in the plasma processing apparatus illustrated in FIG. 1 in an enlarged scale.
Figure 3:
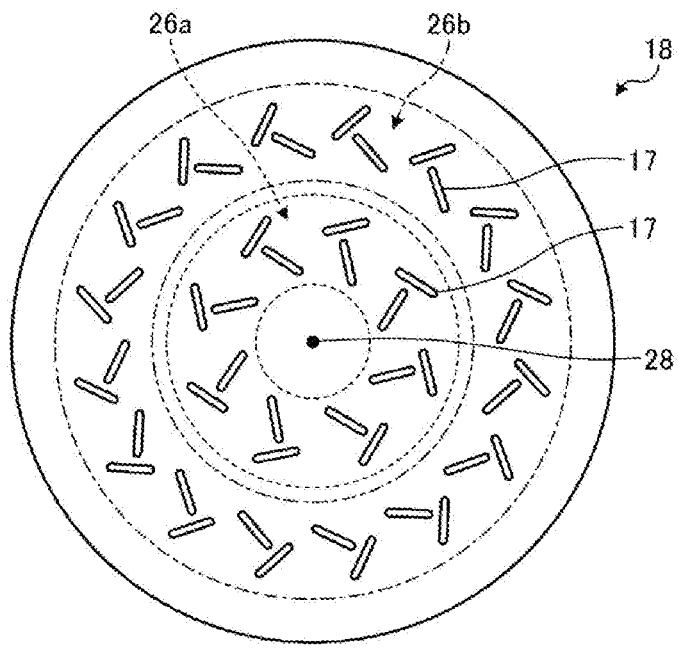
FIG. 3 is a view illustrating a slot antenna plate provided in the plasma processing apparatus illustrated in FIG. 1 when viewed from a direction indicated by arrow III of FIG. 1.
Figure 4:
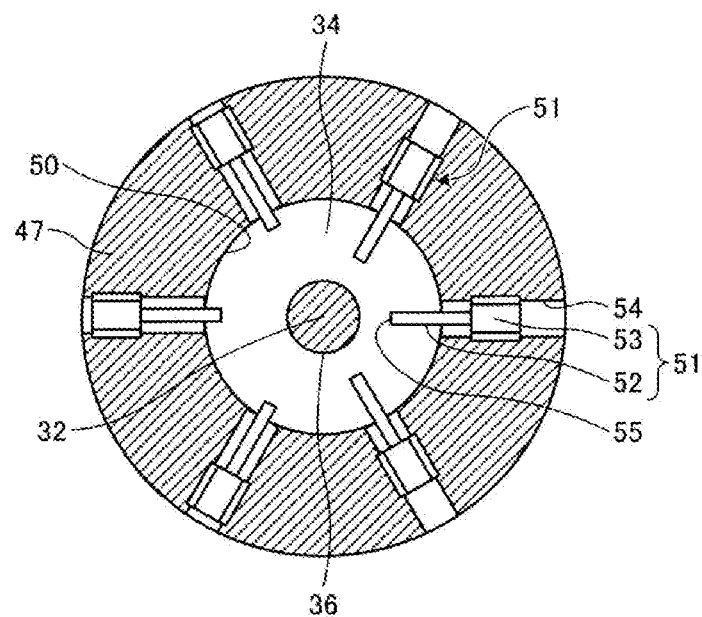
FIG. 4 is a cross-sectional view of the coaxial waveguide provided in the plasma processing apparatus illustrated in FIG. 1 when cutting along line IV-IV of FIG. 2.

FIG. 1 is a schematic cross-sectional view illustrating a main part of a plasma processing apparatus according to a first exemplary embodiment. FIG. 2 is a schematic cross-sectional view illustrating the vicinity of a coaxial waveguide provided in the plasma processing apparatus illustrated in FIG. 1 in an enlarged scale. FIG. 3 is a view illustrating a slot antenna plate provided in the plasma processing apparatus illustrated in FIG. 1 when viewed from a direction indicated by arrow III of FIG. 1. FIG. 4 is a cross-sectional view of the coaxial waveguide provided in the plasma processing apparatus illustrated in FIG. 1 when cutting along line IV-IV of FIG. 2. In the meantime, the vertical direction of the paper sheet is defined as a vertical direction of the plasma processing apparatus in FIGS. 1 and 2. Further, in the present specification, a diametric direction refers to a direction that is directed from an inner conductor included in the coaxial waveguide toward an outer conductor in FIG. 4.

A plasma processing apparatus 11 illustrated in FIGS. 1 and 2 includes a processing container 12, a gas supply unit 13, a holding stand 14, a microwave generator 15, a dielectric member 16, an antenna 20, and a coaxial waveguide 31.

The upper side of the processing container 12 is opened and a processing space S for performing a plasma processing on a substrate to be processed ("processing target substrate") W is defined inside the processing container 12. The processing container 12 includes a bottom part 21 positioned at the lower side of the holding stand 14 and a sidewall 22 extending upwardly from an outer peripheral portion of the bottom part 21. The sidewall 22 has a cylindrical shape. An exhaust hole 23 for exhausting gas is formed at the central portion of the bottom part 21 of the processing container 12 in the diametric direction. The upper side of the processing container 12 is opened, and the processing container 12 may be sealed by the dielectric member 16 disposed on the upper side of the processing container 12 and an O ring 24 interposed as a seal member between the dielectric member 16 and the processing container 12. The dielectric member 16 includes a facing surface 16a that faces the processing space S. The dielectric member 16 is made of a dielectric. A specific material of the dielectric member 16 may be, for example, quartz or alumina.

The gas supply unit 13 supplies a gas for plasma excitation and a gas for plasma processing into the processing container 12. A portion of the gas supply unit 13 is provided to be embedded in the sidewall 22 and supplies the gas from the outside of the processing container 12 into the processing space S inside the processing container 12. In the meantime, a detailed configuration of the gas supply unit 13 will be described later.

The holding stand 14 is disposed within the processing container 12 and holds the processing target substrate W.

The microwave generator 15 is disposed outside the processing container 12 and generates microwaves for plasma excitation. Further, in the first exemplary embodiment, the plasma processing apparatus 11 includes a waveguide 39 of which one end portion is connected to the microwave generator 15, and a mode converter 40 that converts a mode of the microwaves. The waveguide 39 is provided to extend in a horizontal direction, specifically, a left and right direction on the paper sheet of FIG. 1. In the meantime, a waveguide having a circular cross-section or a rectangular cross-section is used as the waveguide 39.

The antenna 20 is provided on the surface 16b opposite to the facing surface 16a of the dielectric member 16 and radiates the microwaves for plasma generation into the processing space S through the dielectric member 16 based on the microwaves generated by the microwave generator 15. The antenna 20 includes a slot antenna plate 18 and a slow wave plate 19.

The slot antenna plate 18 is a thin plate-shaped member that is disposed on the surface 16b opposite to the facing surface 16a of the dielectric member 16 and radiates microwaves onto the dielectric member 16. Each of the opposite surfaces of the slot antenna plate 18 in the plate thickness direction is flat. In the slot antenna plate 18, as illustrated in FIG. 3, a plurality of slot holes 17 are formed through the slot antenna plate 18 in the plate thickness direction. Each of the slot holes 17 is configured such that two rectangular openings form one pair and are arranged in a substantially T shape. The formed slot holes 17 are generally divided into a group of inner circumferential side slot holes 26a arranged at the inner circumferential side and a group of outer circumferential side slot holes 26b arranged at the outer circumferential side. The group of inner circumferential side slot holes 26a refers to eight slot holes 17 formed within a range surrounded by a dotted line in FIG. 3. The group of outer circumferential side slot holes 26b refers to sixteen slot holes 17 formed within a range surrounded by a dashed line of FIG. 3. In the group of inner circumferential side slot holes 26a, the eight slot holes 17 are annularly arranged at regular intervals. In the group of outer circumferential side slot holes 26b, the sixteen slot holes 17 are annularly arranged at regular intervals. The slot antenna plate 18 has a rotational symmetry property about a center 28 in the diametric direction and has the same shape, for example, even in a case of being rotated 45° about the center 28.

The slow wave plate 19 is disposed on the slot antenna plate 18 and propagates microwaves in the diametric direction. An opening is formed at the central portion of the slow wave plate 19 so as to dispose the inner conductor 32 included in the coaxial waveguide 31 to be described below therein. An inner diameter side end portion of the slow wave plate 19 forming the periphery of the opening protrudes in the plate thickness direction. That is, the slow wave plate 19 includes a ring-shaped slow wave plate protrusion 27 protruding from the inner diameter side end portion in the plate thickness direction. The slow wave plate 19 is attached such that the slow wave plate protrusion 27 is positioned on the upper side thereof. The material of the slow wave plate 19 is dielectric. A specific material of the slow wave plate 19 may be, for example, quartz or alumina. The wavelength of the microwaves propagated in the slow wave plate 19 becomes shorter than that of the microwaves propagated in the atmosphere.

All of the dielectric member 16, the slot antenna plate 18, and the slow wave plate 19 have a disk shape. The plasma processing apparatus 11 is manufactured such that the center of the dielectric member 16 in the diametric direction, the center 28 of the slot antenna plate 18 in the diametric direction, and the center of the slow wave plate 19 in the diametric direction are aligned with each other. By doing this, for the microwaves propagated from the central side toward the outer diameter side, the propagation degrees of microwaves in the circumferential direction are made to be equal to each other so as to ensure the uniformity of plasma generated below the dielectric member 16, in the circumferential direction. Here, the center 28 of the slot antenna plate 18 in the diametric direction is set as a reference.

The coaxial waveguide 31 is a waveguide that supplies microwaves to the antenna 20. The coaxial waveguide 31 includes an inner conductor 32 and an outer conductor 33. The inner conductor 32 is formed to be a substantially round rod shape. One end portion 35 of the inner conductor 32 is connected to the center 28 of the slot antenna plate 18. The outer conductor 33 is provided on the outer diameter side of the inner conductor 32 with a gap 34 being interposed therebetween in the diametric direction. The outer conductor 33 is formed in a substantially cylindrical shape. That is, the coaxial waveguide 31 is configured by combining the inner conductor 32 and the outer conductor 33 with each other such that the outer peripheral surface 36 of the inner conductor 32 faces the inner peripheral surface 37 of the outer conductor 33. The coaxial waveguide 39 is provided to extend in the vertical direction of the paper sheet of FIG. 1. The inner conductor 32 and the outer conductor 33 are manufactured as separate bodies, respectively. Also, the inner conductor 32 and the outer conductor 33 are combined by aligning the center of the inner conductor 32 in the diametric direction with the center of the outer conductor 33 in the diametric direction.

The microwaves generated by the microwave generator 15 are propagated into the antenna 20 through the waveguide 39 and the coaxial waveguide 31. As the frequency of microwaves generated by the microwave generator 15, for example, 2.45 GHz is selected.

For example, the TE mode microwaves of generated by the microwave generator 15 are propagated within the waveguide 39 to the left side of the paper sheet as indicated by arrow A1 of FIG. 1, and converted into the TEM mode by the mode converter 40. Also, the microwaves converted into the TEM mode are propagated within the coaxial waveguide 31 to the lower side of the paper sheet as indicated by arrow A2 of FIG. 1. Specifically, the microwaves are propagated between the inner conductor 32 and the outer conductor 33, where the gap 34 is formed, and between the inner conductor 32 and the cooling plate protrusion 47. The microwaves propagated in the coaxial waveguide 31 are propagated within the slow wave plate 19 in the diametric direction and are radiated to the dielectric member 16 from the plurality of slot holes 17 formed in the slot antenna plate 18. The microwaves, which have penetrate through the dielectric member 16, generate an electric field just below the dielectric member 16 so as to generate plasma in the processing container 12.

Further, the plasma processing apparatus 11 includes: a dielectric plate pressing ring 41 that is arranged on the upper side of the opening side upper end portion of the sidewall 22 and presses the dielectric member 16 from the upper side; an antenna pressing unit 42 that is arranged on the upper side of the dielectric plate pressing ring 41 and presses, for example, the slot antenna plate 18 from the upper side; a cooling plate 43 that is arranged on the upper side of the slow wave plate 19 and cools, for example, the slow wave plate 19; an electromagnetic shielding elastic body 44 that is arranged to be interposed between the antenna pressing unit 42 and the cooling plate 43 and shields the electromagnetic field inside and outside the processing container 12; an outer periphery fixing ring 45 that fixes the outer peripheral portion of the slot antenna plate 18; and a center fixing plate 46 that fixes the center of the slot antenna plate 18.

As illustrated in FIG. 2, an opening used for disposing the coaxial waveguide 31 therein is formed at the central portion of the cooling plate 43. The inner diameter side end portion of the cooling plate 43, which forms the periphery of the opening, protrudes in the plate thickness direction. That is, the cooling plate 43 includes a ring-shaped cooling plate protrusion 47 that protrudes from the inner diameter side end portion in the plate thickness direction. The cooling plate 43 is attached such that the cooling plate protrusion 47 is positioned at the upper side.

The cylindrical outer conductor 33 is arranged on the cooling plate protrusion 47. Accordingly, the upper end portion of the cooling plate protrusion 47 is in contact with the lower end portion of the outer conductor 33. In this case, the inner peripheral surface 37 of the outer conductor 33 is continuous to the inner peripheral surface 50 of the cooling plate protrusion 47 and a distance between the outer peripheral surface 36 of the inner conductor 32 and the inner peripheral surface 37 of the outer conductor 33 becomes equal to a distance between the outer peripheral surface 36 of the inner conductor 32 and the inner peripheral surface 50 of the cooling plate protrusion 47 in the diametric direction. The inner peripheral surface 37 of the outer conductor 33 is continuous to the inner peripheral surface 50 of the cooling plate protrusion 47 such that the cooling plate protrusion 47 is configured as a portion of the coaxial waveguide 31. In the meantime, the gap 34 formed between the inner conductor 32 and the outer conductor 33 is positioned above the slow wave plate protrusion 27.

Further, on the outer peripheral portion of the cooling plate 43, a slow wave plate positioning portion 48 is formed which protrudes to the dielectric member 16 in a ring shape. The slow wave plate 19 is positioned in the diametric direction by the slow wave plate positioning portion 48. The outer periphery fixing ring 45 fixes the slot antenna plate 18 in a position in the diametric direction where the slow wave plate positioning portion 48 is formed.

In the meantime, in the central portion in the diametric direction of an upper side surface of the dielectric member 16, an accommodation recess 49, which is recessed from the upper side surface of the dielectric member 16 to reduce the plate thickness, is formed so as to accommodate the center fixing plate 46.

Further, as illustrated in FIGS. 2 and 4, the plasma processing apparatus 11 includes a plurality of stub members 51 extendible from the outer conductor 33 side toward the inner conductor 32 side as a changing member that changes a distance in the diametric direction between a portion of the outer peripheral surface 36 of the inner conductor 32 and a facing part that faces the portion of the outer peripheral surface of the inner conductor 32 in the diametric direction. In the meantime, in the present exemplary embodiment, the facing part that faces the portion of the outer peripheral surface of the inner conductor 32 in the diametric direction corresponds to the cooling plate protrusion 47.

Each of the stub members 51 includes a rod-shaped part 52 supported at the outer conductor 33 side and provided to extend in the diametric direction, and a screw part 53 as a movement amount adjusting member to adjust the movement amount of the rod-shaped part 52 in the diametric direction. The screw part 53 is provided on the outer diameter side end portion of the rod-shaped part 52.

Each of the stub members 51 is inserted into the cooling plate protrusion 47. Specifically, in the cooling plate protrusion 47, the screw holes 54 extending straightly in the diametric direction through the cooling plate protrusion 47 are formed and each of the stub members 51 is inserted into the cooling plate protrusion 47 by screwing the screw holes 54 with the screw parts 53, respectively. That is, the stub members 51 are supported by the screw parts 53 screwed to the screw holes 54 formed in the cooling plate protrusion 47 at the outer conductor 33 side.

By rotating the screw parts 53, the stub members 51, each including the rod-shaped part 52, may be entirely moved in the diametric direction. In FIG. 2, the stub members 51 are movable in the left and right directions of the paper sheet. Further, the movement amount of the stub members 51 is adjusted by the rotational amount of the screw parts 53.

A plurality of stub members 51 (six stub members in FIG. 4) are provided within the cooling plate protrusion 47 at the periphery of the inner conductor 32 to be arranged at substantially equal intervals in the circumferential direction. For example, in the case where six stub members are provided, six stub members 51 are arranged such that an angle between adjacent stub members becomes an interval of 60° in the circumferential direction.

Each of the plurality of stub members 51 may independently move in the diametric direction. That is, diametric positions of tip end portions 55 of the rod-shaped parts 52 included in the stub members 51 are individually adjusted, respectively.

Figure 5:
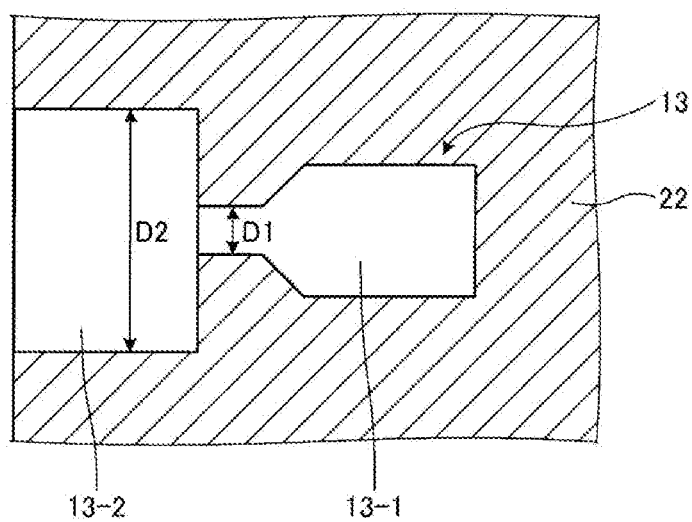
FIG. 5 is an enlarged cross-sectional view of a gas supply unit and a side wall of a processing container in the first exemplary embodiment.

Next, descriptions will be made on a detailed configuration of the gas supply unit 13 illustrated in FIG. 1. FIG. 5 is an enlarged cross-sectional view of a gas supply unit and a side wall of the processing container in the first exemplary embodiment.

As illustrated in FIG. 5, the gas supply unit 13 includes a transport hole 13-1 and an injection hole 13-2 communicated to the transport hole 13-1. The transport hole 13-1 transports the gas to a position (hereinafter, referred to as an "intermediate position") where the gas does not reach the processing space S in the sidewall 22 of the processing container 12. The transport hole 13-1 is formed in a tapered shape in which the diameter thereof becomes smaller as a position on the transport hole 13-1 becomes nearer to the tip end thereof. Because the transport hole 13-1 is formed in the tapered shape, the pressure of the gas transported to the intermediate position of the sidewall 22 of the processing container 12 by the transport hole 13-1 is increased.

The injection hole 13-2 injects the gas transported to the intermediate position of the sidewall 22 of the processing container 12 by the transport hole 13-1 into the processing space S. The injection hole 13-2 has a diameter larger than that of the transport hole 13-1. In the example of FIG. 5, assuming that the diameter of a tip end portion with the smallest diameter in the transport hole 13-1 is D1 and the diameter of the injection hole 13-2 is D2, a relationship of D1<D2 is established. Because the diameter of the injection hole 13-2 is larger than the diameter of the transport hole 13-1, the pressure of the gas injected from the injection hole 13-2 into the processing space S is reduced compared with the pressure of the gas transported by the transport hole 13-1. Therefore, the pressure within the injection hole 13-2 or the pressure in the vicinity of the injection hole 13-2 is prevented from excessively increasing.

Figure 6:
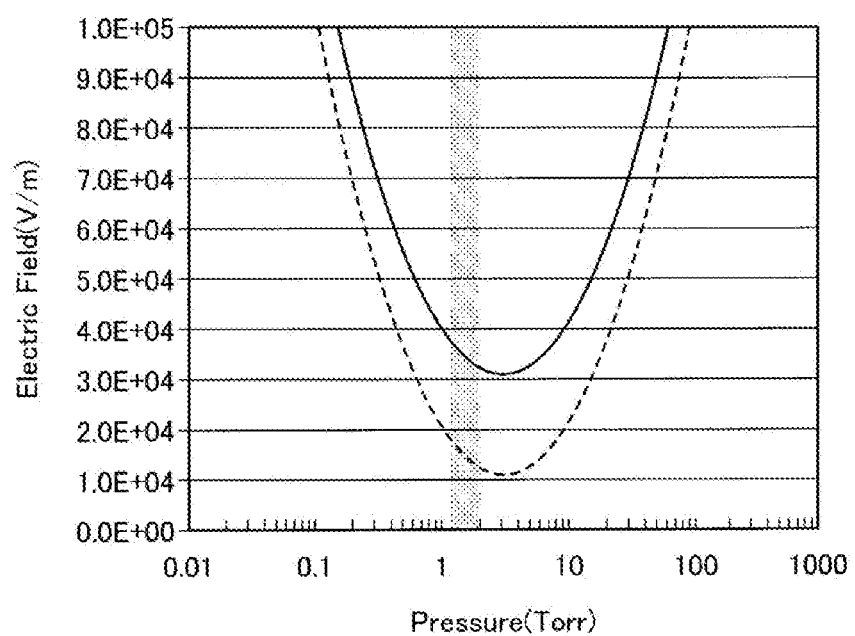
FIG. 6 is a graph representing a relationship between a pressure of gas and an electric field intensity that generates electric discharge.

FIG. 6 is a graph illustrating a relationship between a pressure of gas and an electric field intensity that generates electric discharge. A curve indicated at the upper side of FIG. 6 indicates a relationship between a pressure of Ar (argon) gas in a vacuum and electric field intensity that generates electric discharge. The curve indicated at the upper side of FIG. 6 is also referred to as the Paschen's curve. A curve indicated at the lower side of FIG. 6 indicates a relationship between a pressure of Ar (argon) gas contained in plasma and electric field intensity that generates electric discharge. In the meantime, the curve indicated at the lower side of FIG. 6 is a curve estimated from the Paschen's curve indicated at the upper side of FIG. 6.

As is evident from the curve of FIG. 6, when the pressure of the gas is from 1 Torr to 10 Torr, the electric field intensity to generate electric discharge becomes smallest. That is, the curve of FIG. 6 indicates that a possibility of generation of electric discharge becomes highest when the pressure of gas is in the range of 1 Torr to 10 Torr. As a result of intensive studies through, for example, a simulation or test performed by the inventors of the present application, it has been found that electric discharge is actually generated when the pressure of the injected gas is in the range of 1 Torr to 2 Torr.

Figure 7:
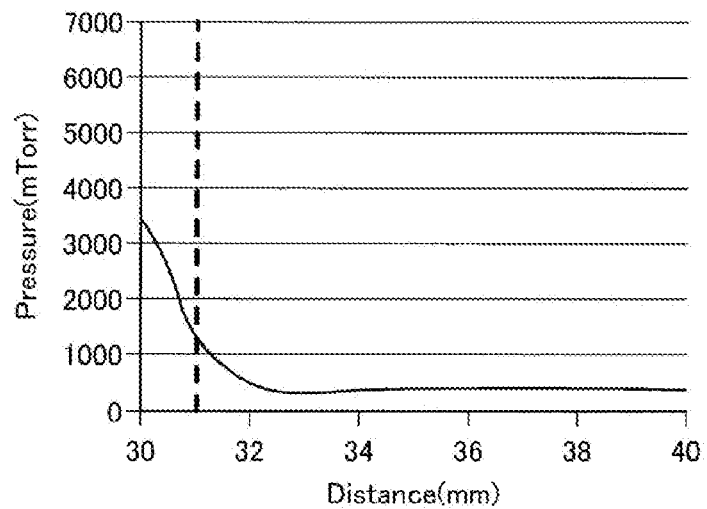
FIG. 7 is a graph representing an example of simulation results of a relationship between a pressure of gas in the injection hole and a position inside a sidewall of a processing container in the first exemplary embodiment.
Figure 8:
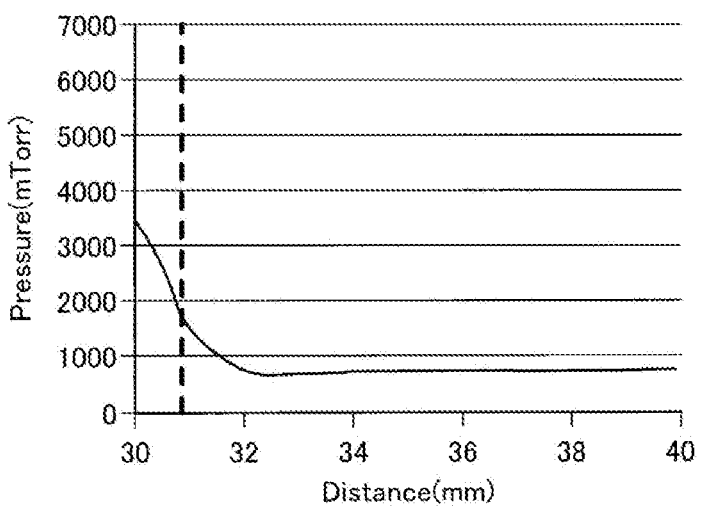
FIG. 8 is a graph representing an example of simulation results of a relationship between a pressure of gas in the injection hole and a position inside the sidewall of the processing container in the first exemplary embodiment.

FIGS. 7 and 8 are graphs illustrating examples of simulation results of a relationship between a pressure of gas in an injection hole and a position inside a sidewall of a processing container 12 in the first exemplary embodiment. In the graphs illustrated in FIGS. 7 and 8, the horizontal axis indicates a distance form a predetermined reference position to the position inside the sidewall of the processing container 12. Further, in FIGS. 7 and 8, the position of the dotted line indicates the intermediate position of the sidewall 22 of the processing container 12 and a position located at the right of the dotted line indicates the position corresponding to the injection hole 13-2.

Further, in the simulation of FIG. 7, the processing gas of 1100 sccm Ar and a 400 mTorr of internal pressure of the processing container are used as simulation conditions. Further, in the simulation of FIG. 8, the following simulation conditions were used: the processing gas: Ar=1100 sccm and the internal pressure of the processing container: 750 mTorr.

As is evident from simulation results of FIGS. 7 and 8, when the gas transported to the intermediate position of the sidewall 22 of the processing container 12 through the transport hole 13-1 is made to circulate in the injection hole 13-2, the pressure within the injection hole 13-2 is reduced to the pressure within the processing container. That is, when the gas is made to circulate in the injection hole 13-2 having a diameter larger than that of the transport hole 13-1, the pressure of the gas injected from the injection hole 13-2 may be reduced to a pressure lower than 1 Torr.

As is evident from the curve of FIG. 6 and the simulation results of FIGS. 7 and 8, when the gas is injected from the injection hole 13-2 having a diameter larger than that of the transport hole 13-1 into the processing space S such, it is possible to reduce the pressure of gas to a range out of the range of 1 Torr to 2 Torr at which electric discharge is easily generated. In other words, when the gas is injected into the processing space S from the injection hole 13-2 having the diameter larger than that of the transport hole 13-1, it is possible to avoid the generation of electric discharge that is caused by the increase of the pressure.

Descriptions will be returned back to the description of FIG. 5. The diameter D2 of the injection hole 13-2 may be smaller than a predetermined upper limit value. Also, the predetermined upper limit value may be determined by using the following Equation (1).

$$a < Pnm/(2\pi f(\mu\varepsilon)^{1/2}) \quad (1)$$

where, "a" is a radius of the injection hole (the predetermined upper limit value/2), "Pnm" is a Bessel function, "f" is a frequency of microwaves, "μ" is a permeability, and "ε" is a dielectric constant.

As described above, the diameter D2 of the injection hole 13-2 is made smaller than the predetermined upper limit value determined by Equation (1) such that it becomes possible to suppress leakage of the microwaves from the processing space S into the injection hole 13-2.

Figures 9, 10:
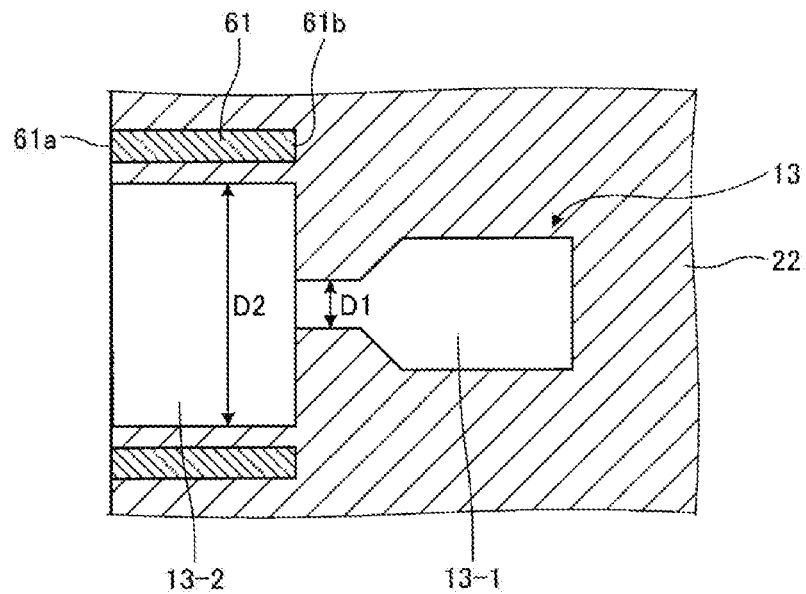
FIG. 9 is a graph representing an example of simulation results of a relationship between a diameter of the injection hole and a leakage rate of microwaves in the first exemplary embodiment.
FIG. 10 is an enlarged cross-sectional view of a gas supply unit, a sidewall of a processing container, and a cylindrical dielectric in a second exemplary embodiment.

FIG. 9 is a graph illustrating an example of simulation results of a relationship between a diameter of the injection hole and a leakage rate of microwaves in the first exemplary embodiment. In FIG. 9, a "hole radius" indicates a radius of the injection hole 13-2 corresponding to the diameter D2 of the injection hole 13-2. Further, a "MW leak rate [%]" indicates a leakage rate that is a ratio of an intensity of the microwaves leaked into the injection hole 13-2 to an intensity of the microwaves input to the processing space S.

As is evident from the simulation results of FIG. 9, when the diameter D2 of the injection hole 13-2 is made smaller than the predetermined upper limit value, the leakage rate of microwaves is improved to be less than 1%. Here, the predetermined upper limit value refers to a predetermined upper limit value determined by Equation (1). That is, it has been found out that when the diameter D2 of the injection hole 13-2 is made smaller than the predetermined upper limit value determined by Equation (1), it becomes possible to suppress the increase of the leakage of the microwaves from the processing space S into the injection hole 13-2.

In the foregoing, according to the plasma processing apparatus 11 of the first exemplary embodiment, a gas is transported to the intermediate position of the sidewall 22 of the processing container 12 by the transport hole 13-1 and injected into the processing space S by the injection hole 13-2 having the diameter larger than that of the transport hole 13-1. As a result, according to the first exemplary embodiment, since the pressure of the gas may be reduced to a range other than the range of pressure at which electric discharge is easily generated, it is possible to introduce the gas without generating electric discharge due to the increase of the pressure.

Further, according to the plasma processing apparatus 11 of the first exemplary embodiment, since the diameter of the injection hole 13-2 is made smaller than the predetermined upper limit value, it is possible to suppress the increase of the leakage of the microwaves from the processing space S into the injection hole 13-2. As a result, according to the first exemplary embodiment, since the electric field intensity of the injection hole 13-2 or in the vicinity of the injection hole 13-2 may be reduced, it is possible to prevent electric discharge from being generated in the injection hole 13-2 or in the vicinity of the injection hole 13-2.

Second Exemplary Embodiment

Figure 11:
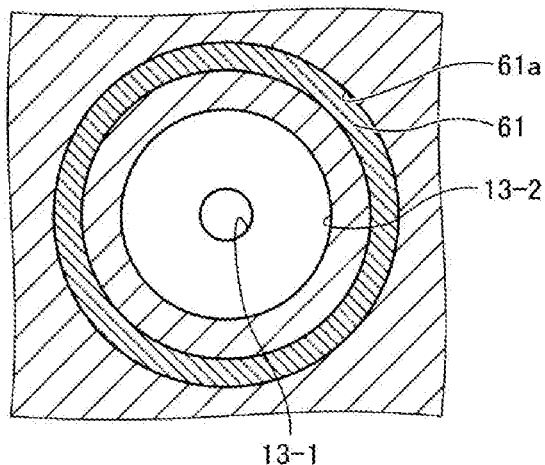
FIG. 11 is a front view of the gas supply unit, the sidewall of the processing container, and the cylindrical dielectric illustrated in FIG. 10 when viewed from one end side of the cylindrical dielectric.

FIG. 10 is an enlarged cross-sectional view of the gas supply unit, the sidewall of the processing container, and a cylindrical dielectric in a second exemplary embodiment. FIG. 11 is a front view of the gas supply unit, the sidewall of the processing container, and the cylindrical dielectric illustrated in FIG. 10 when viewed from one end side of the cylindrical dielectric. In the meantime, since constitutional elements in FIGS. 10 and 11, which are assigned the same reference numerals as those in FIG. 5, have the same or substantially the same function as those in FIG. 5 except for the features to be described below, descriptions thereof will be omitted.

As illustrated in FIG. 10 and FIG. 11, the plasma processing apparatus according to the second exemplary embodiment further includes a cylindrical dielectric 61 embedded in the sidewall 22 of the processing container 12 to surround a periphery of the injection hole 13-2 in a state where one end 61a thereof is exposed to the processing space S. The cylindrical dielectric 61 guides the microwaves radiated into the processing space S by the antenna 20 from one end 61a to the other end 61b embedded in the sidewall 22. The microwaves guided to the other end 61b by the cylindrical dielectric 61 are reflected on the other end 61b and the reflected microwaves and the microwaves before reflection are cancelled with each other. By doing this, the increase of the leakage of the microwaves from the processing space S into the injection hole 13-2 is suppressed such that the electric field intensity in the injection hole 13-2 or in the vicinity of the injection hole 13-2 is reduced.

When a wavelength of the microwaves propagating at an inside of the cylindrical dielectric 61 is λ, a length from one end 61a to the other end 61b in the cylindrical dielectric 61 may be λ/5 or more and 3λ/5 or less. As described above, the length from one end 61a to the other end 61b in the cylindrical dielectric 61 is set to be λ/5 or more and 3λ/5 or less such that a phase of the microwaves reflected on the other end 61b is inverted and thus, it becomes possible to efficiently cancel the microwaves which are not yet advanced into the dielectric.

Figure 12:
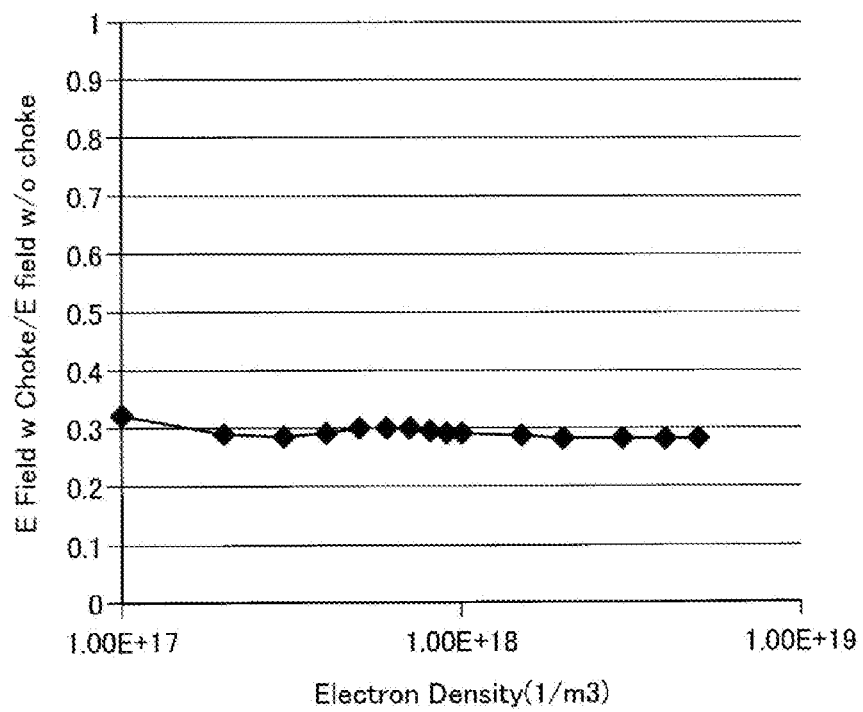
FIG. 12 is a graph representing an example of simulation results of an electric field intensity of an injection hole depending on whether the cylindrical dielectric is present or not in the second exemplary embodiment.

FIG. 12 is a graph illustrating an example of simulation results of an electric field intensity of the injection hole depending on whether the cylindrical dielectric is present or not in the second exemplary embodiment. In the graph illustrated in FIG. 12, the horizontal axis indicates an electron density in the processing space S and the vertical axis indicates a ratio of the electric field intensity of the injection hole 13-2 for the case where the cylindrical dielectric 61 is embedded to the electric field intensity of the injection hole 13-2 for a case where the cylindrical dielectric 61 is not present.

As is apparent from the simulation results of FIG. 12, in a case where the cylindrical dielectric 61 is embedded, the electric field intensity of the injection hole 13-2 was improved by approximately 70% as compared with a case where the cylindrical dielectric 61 is not present.

In the foregoing, according to the plasma processing apparatus of the second exemplary embodiment, since the cylindrical dielectric 61 is embedded in the sidewall 22 of the processing container 12 to surround the periphery of the injection hole 13-2, it is possible to suppress the increase of the leakage of the microwaves from the processing space S into the injection hole 13-2. As a result, according to the second exemplary embodiment, since the electric field intensity in the injection hole 13-2 or in the vicinity of the injection hole 13-2 may be reduced, it is possible to introduce the gas without generating electric discharge due to the increase of the pressure and also more efficiently prevent electric discharge from being generated in the injection hole 13-2 or in the vicinity of the injection hole 13-2.

Third Exemplary Embodiment

Figure 13:
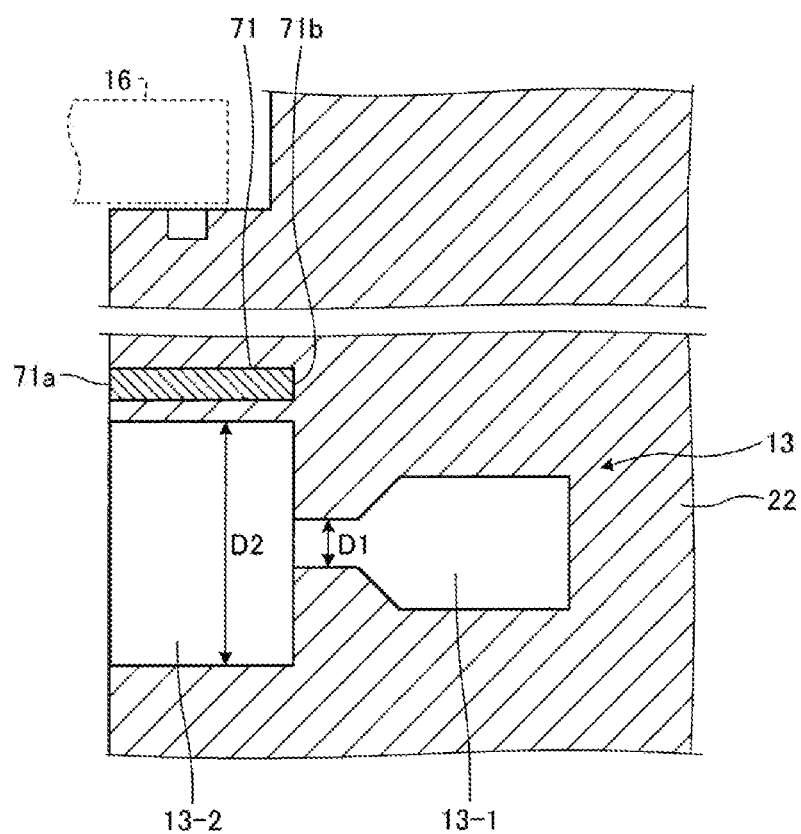
FIG. 13 is an enlarged cross-sectional view of a gas supply unit, a sidewall of a processing container, and a plate-shaped dielectric in a third exemplary embodiment.

FIG. 13 is an enlarged cross-sectional view of the gas supply unit, the sidewall of the processing container, and a plate-shaped dielectric in a third exemplary embodiment. In the meantime, since constitutional elements assigned the same reference numerals as those of FIG. 5 in FIG. 13 have the same or substantially the same function as those in FIG. 5 except for the descriptions which will be made in the following, descriptions thereof will be omitted.

As illustrated in FIG. 13, the plasma processing apparatus according to the third exemplary embodiment further includes a plate-shaped dielectric 71 embedded in an area interposed between the injection hole 13-2 and the dielectric member 16 in the sidewall 22 of the processing container 12 in a state where one end 71a thereof is exposed to the processing space S. More specifically, the plate-shaped dielectric 71 is annularly embedded in a recess formed along the circumferential direction of the sidewall 22 in the area interposed between the injection hole 13-2 and the dielectric member 16 in the sidewall 22 of the processing container 12, in a state where the one end 71a is exposed to the processing space S. The plate-shaped dielectric 71 guides the microwaves radiated into the processing space S by the antenna 20 from one end 71a to the other end 71b embedded in the sidewall 22. The microwaves guided to the other end 71b by the plate-shaped dielectric 71 are reflected on the other end 71b, and the reflected microwaves and the microwaves before being reflected are cancelled with each other. By this, the increase of the leakage of the microwaves from the processing space S into the injection hole 13-2 is suppressed such that the electric field intensity in the injection hole 13-2 or in the vicinity of the injection hole 13-2 is reduced.

Assuming that the wavelength of the microwaves propagated in the plate-shaped dielectric 71 is λ, the length from one end 71a to the other end 71b in the plate-shaped dielectric 71 may be λ/5 or more and 3λ/5 or less. As described above, when the length from one end 71a to the other end 71b in the plate-shaped dielectric 71 is set to be λ/5 or more and 3λ/5 or less, a phase of the microwaves reflected on the other end 71b is inverted and thus it becomes possible to efficiently cancel the microwaves before being reflected.

In the foregoing, according to the plasma processing apparatus of the third exemplary embodiment, since the plate-shaped dielectric 71 is embedded in the area interposed between the injection hole 13-2 and the dielectric member 16 in the sidewall 22 of the processing container 12, it is possible to suppress the increase of the leakage of the microwaves from the processing space S into the injection hole 13-2. As a result, according to the third exemplary embodiment, since the electric field intensity in the injection hole 13-2 or in the vicinity of the injection hole 13-2 may be reduced, it is possible to introduce the gas without generating electric discharge due to the increase of the pressure and also more efficiently prevent electric discharge from being generated in the injection hole 13-2 or in the vicinity of the injection hole 13-2.

Fourth Exemplary Embodiment

Figure 14:
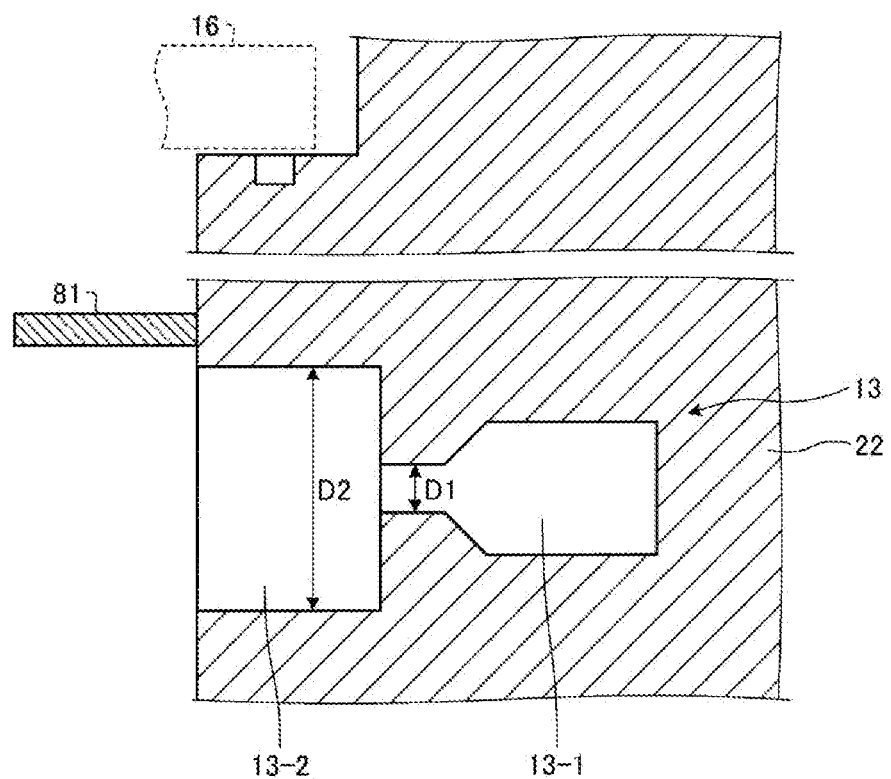
FIG. 14 is an enlarged cross-sectional view of a gas supply unit, a sidewall of a processing container, and a plate-shaped conductor in a fourth exemplary embodiment.

FIG. 14 is an enlarged cross-sectional view of the gas supply unit, the sidewall of the processing container, and a plate-shaped conductor in a fourth exemplary embodiment. In the meantime, since the constitutional elements in FIG. 14, which are assigned the same reference numerals as those of FIG. 5, have the same or substantially the same function as those in FIG. 5 except for the features described below, descriptions thereof will be omitted.

As illustrated in FIG. 14, the plasma processing apparatus according to the fourth exemplary embodiment further includes a plate-shaped conductor 81 provided to protrude from an area interposed between the injection hole 13-2 and the dielectric member 16 of the sidewall 22 of the processing container 12 toward the processing space S. More specifically, the plate-shaped conductor 81 is provided to annularly protrude from an area interposed between the injection hole 13-2 and the dielectric member 16 of the sidewall 22 of the processing container 12 toward the processing space S. The plate-shaped conductor 81 shields the microwaves radiated into the processing space S by the antenna 20. By doing this, the increase of the leakage of the microwaves from the processing space S into the injection hole 13-2 is suppressed such that the electric field intensity in the injection hole 13-2 or in the vicinity of the injection hole 13-2 is reduced.

Figure 15:
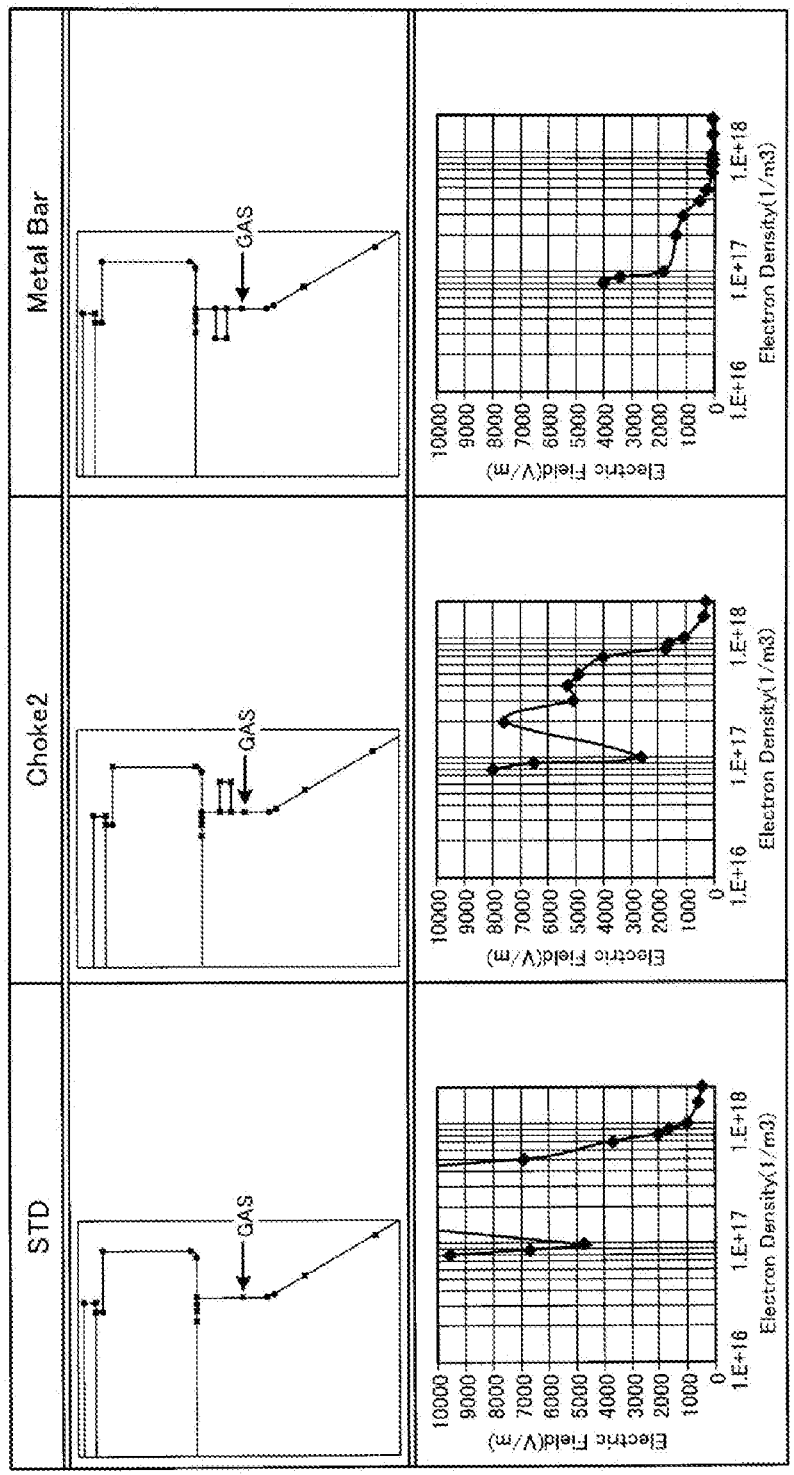
FIG. 15 illustrates graphs representing examples of simulation results of the electric field intensity of the injection hole depending on whether the plate-shaped dielectric in the third exemplary embodiment or the plate-shaped conductor in the fourth exemplary embodiment is present or not.

FIG. 15 illustrates graphs representing examples of simulation results of an electric field intensity of the injection hole depending on whether the plate-shaped dielectric in the third exemplary embodiment or the plate-shaped conductor in the fourth exemplary embodiment is present or not. In FIG. 15, the graph "STD" represents the electric field intensity of the injection hole 13-2 for a case where both of the plate-shaped dielectric 71 and the plate-shaped conductor 81 are not present. Further, the graph "Choke 2" represents the electric field intensity of the injection hole 13-2 for a case where the plate-shaped dielectric 71 is embedded. Further, the graph "Metal Bar" represents the electric field intensity of the injection hole 13-2 in the case where the plate-shaped conductor 81 is provided to protrude. Further, in the respective graphs illustrated in FIG. 15, the horizontal axis indicates an electron density in the processing space S and the vertical axis indicates the electric field intensity. Further, in the simulation of FIG. 15, 3 KW of input microwave power is used as simulation condition.

As is apparent from the simulation results of FIG. 15, in a case where the plate-shaped dielectric 71 is embedded, the electric field intensity of the injection hole 13-2 is reduced as compared with the case where both of the plate-shaped dielectric 71 and the plate-shaped conductor 81 are not present.

Further, as is apparent from the simulation results of FIG. 15, in a case where the plate-shaped conductor 81 is provided to protrude, the electric field intensity of the injection hole 13-2 is reduced as compared with the case the plate-shaped dielectric 71 is embedded. That is, it has been found out that the plate-shaped conductor 81 is provided to protrude such that the electric field intensity of the injection hole 13-2 may be most efficiently reduced.

In the foregoing, according to the plasma processing apparatus of the fourth exemplary embodiment, since the plate-shaped conductor 81 is provided to protrude from an area interposed between the injection hole 13-2 and the dielectric member 16 of the sidewall 22 of the processing container 12, it is possible to suppress the increase of the leakage of the microwaves from the processing space S into the injection hole 13-2. As a result, according to the fourth exemplary embodiment, since the electric field intensity of the injection hole 13-2 or in the vicinity of the injection hole 13-2 may be reduced, it is possible to introduce the gas without generating electric discharge due to the increase of pressure and more efficiently prevent electric discharge from being generated in the injection hole 13-2 or in the vicinity of the injection hole 13-2.

In the meantime, in the first to fourth exemplary embodiments, an example in which the diameter D2 of the injection hole 13-2 is constant is described, but the present disclosure is not limited thereto. For example, the diameter D2 of the injection hole 13-2 may be increased as going away from the transport hole 13-1. By doing this, since it is possible to easily inject gas from the injection hole 13-2 and reduce the pressure of the gas to a range other than the range of pressure at which electric discharge is easily generated, the gas may be stably introduced without generating the electric discharge due to the increase of pressure.

Further, in the second exemplary embodiment, the cylindrical dielectric 61 is embedded in the sidewall 22 of the processing container 12 to surround the periphery of the injection hole 13-2 communicated to the transport hole 13-1, but the present disclosure is not limited thereto. For example, a structure in which only an injection hole of a single-stage is formed in the sidewall 22 of the processing container 12 may also be adopted, instead of a two-stage structure including the transport hole 13-1 and the injection hole 13-2. In the structure, the cylindrical dielectric 61 may be embedded in the sidewall 22 of the processing container 12 to surround a periphery of the injection hole of the single-stage. By doing this, even when the structure in which only the injection hole of the single-stage is formed in the sidewall 22 of the processing container 12 is adopted, it is possible to introduce gas without generating electric discharge due to the increase of the pressure.

Further, in the third exemplary embodiment, the plate-shaped dielectric 71 is embedded in the area interposed between the injection hole 13-2 communicated to the transport hole 13-1 and the dielectric member 16 in the sidewall 22 of the processing container 12, but the present disclosure is not limited thereto. For example, a structure in which only an injection hole of a single-stage is formed in the sidewall 22 of the processing container 12 may also be adopted, instead of a two-stage structure including the transport hole 13-1 and the injection hole 13-2. In the structure, the plate-shaped dielectric 71 may be embedded in the area interposed between the injection hole of the single-stage and the dielectric member 16. By doing this, even when the structure in which only the injection hole of the single-stage is formed in the sidewall 22 of the processing container 12 is adopted, it is possible to introduce gas without generating electric discharge due to the increase of the pressure.

Further, in the fourth exemplary embodiment, the plate-shaped conductor 81 is provided to protrude from the area interposed between the injection hole 13-2 and the dielectric member 16 of the sidewall 22 of the processing container 12 toward the processing space S, but the present disclosure is not limited thereto. For example, a structure in which only an injection hole of a single-stage is formed in the sidewall 22 of the processing container 12 may also be adopted, instead of a two-stage structure including the transport hole 13-1 and the injection hole 13-2. In the structure, the plate-shaped conductor 81 may be provided to protrude from an area interposed between the injection hole of the single-stage and the dielectric member 16 toward the processing space S. By doing this, even when the structure in which only the injection hole of the single-stage is formed in the sidewall 22 of the processing container 12 is adopted, it is possible to introduce gas without generating electric discharge due to the increase of the pressure.

Further, in the second to fourth exemplary embodiments, the plasma processing apparatuses include the cylindrical dielectric 61, the plate-shaped dielectric 71, and the plate-shaped conductor 81, respectively, but the present disclosure is not limited thereto. For example, the plasma processing apparatus may include at least one of the cylindrical dielectric 61, the plate-shaped dielectric 71, and the plate-shaped conductor 81.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:
1. A plasma processing apparatus comprising:
a processing container that defines a processing space;
a gas supply path provided on a sidewall of the processing container, the gas supply path being configured to supply a gas to the processing space;
a dielectric member having a facing surface that faces the processing space, and
an antenna provided on a surface opposite to the facing surface of the dielectric member, the antenna being configured to radiate microwaves that turn the gas into plasma to the processing space through the dielectric member, wherein the gas supply path supplies the processing gas to the processing space through a portion of the sidewall of the processing container located below the dielectric member, and the supply path includes:
a transport hole configured to transport the gas to a position in the sidewall spaced from an inside surface of the sidewall of the processing container, and
an injection hole in communication with the transport hole and configured to inject the gas from the transport hole into the processing space, the injection hole opening at the inner surface of the sidewall below the dielectric member, the injection hole further having a diameter larger than that of the transport hole to introduce the gas without generating electric discharge in the injection hole or in the vicinity of the injection hole, wherein:
the injection hole has a fixed diameter,
the transport hole includes a first hole having a fixed diameter and a second hole having a fixed diameter,
the first hole is disposed between the injection hole and the second hole, and
a diameter of the second hole is greater than a diameter of the first hole and less than a diameter of the injection hole.

2. The plasma processing apparatus according to claim 1, wherein the injection hole has an internal wall having a substantially constant diameter throughout the injection hole.

3. The plasma processing apparatus according to claim 1, wherein the diameter of the injection hole and the transport hole is determined such that a gas pressure from the injection hole to the processing space falls below 1 Torr.

4. The plasma processing apparatus of claim 1, wherein an upper limit of a radius of the injection hole is determined to be smaller than $Pnm/(2\pi f(\mu\varepsilon)^{1/2})$ where "Pnm" is a Bessel function, "f" is a frequency of microwaves, "$\mu$" is a permeability, and "$\varepsilon$" is a dielectric constant.

5. The plasma processing apparatus according to claim 1, wherein the transport hole and the injection hole are embedded in the sidewall of the processing container, and the transport hole has a shape that increases a gas pressure toward a connection point between the transport hole and the injection hole.

6. The plasma processing apparatus according to claim 1, further comprising a cylindrical dielectric embedded in the sidewall of the processing container to surround a periphery of the injection hole in a state where one end of the cylindrical dielectric is exposed to the processing space to guide the microwaves radiated into the processing space by the antenna from one end to the other end of the cylindrical dielectric.

7. The plasma processing apparatus according to claim 6, wherein a length from the one end to the other end of the cylindrical dielectric is between $\lambda/5$ and $3\lambda/5$ where $\lambda$ is a wavelength of the microwaves radiated from an inner side of the cylindrical dielectric.

8. The plasma processing apparatus according to claim 1, wherein an entire surface of the injection hole is in contact with the processing space such that the gas is injected to the processing space through the entire surface of the injection hole.

9. The plasma processing apparatus according to claim 1, further comprising a plate-shaped conductor provided to protrude from an area interposed between the injection hole and the dielectric member toward the processing space.

* * * * *